US009230692B2

(12) United States Patent
Eichmeyer (10) Patent No.: US 9,230,692 B2
(45) Date of Patent: Jan. 5, 2016

(54) APPARATUSES AND METHODS FOR MAPPING MEMORY ADDRESSES TO REDUNDANT MEMORY

(71) Applicant: Micron Technology, Inc., Boise, ID (US)

(72) Inventor: Seth Eichmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 13/919,850

(22) Filed: Jun. 17, 2013

(65) Prior Publication Data

US 2014/0369143 A1    Dec. 18, 2014

(51) Int. Cl.
*G11C 29/00* (2006.01)

(52) U.S. Cl.
CPC .............. *G11C 29/76* (2013.01); *G11C 29/785* (2013.01)

(58) Field of Classification Search
CPC .. G11C 29/785; G11C 7/227; G11C 14/0045; G11C 13/0002; H01L 27/11206
USPC .................................... 365/200, 200.1, 185.2
See application file for complete search history.

(56) References Cited

U.S. PATENT DOCUMENTS

| | | | | |
|---|---|---|---|---|
| 5,699,306 | A * | 12/1997 | Lee et al. | 365/200 |
| 6,181,614 | B1 * | 1/2001 | Aipperspach et al. | 365/200 |
| 7,359,261 | B1 * | 4/2008 | Wu et al. | 365/200 |
| 7,633,800 | B2 * | 12/2009 | Adusumilli et al. | 365/185.09 |
| 8,325,546 | B2 * | 12/2012 | Lee | 365/200 |
| 2007/0001720 | A1 * | 1/2007 | Li et al. | 327/143 |
| 2010/0097871 | A1 * | 4/2010 | Fujiwara | 365/200 |
| 2011/0267876 | A1 * | 11/2011 | Min et al. | 365/163 |
| 2011/0280091 | A1 * | 11/2011 | Rooney et al. | 365/200 |
| 2013/0336076 | A1 * | 12/2013 | Jeong et al. | 365/200 |

* cited by examiner

*Primary Examiner* — Shawki S Ismail
*Assistant Examiner* — Muhammad S Islam
(74) *Attorney, Agent, or Firm* — Dorsey & Whitney LLP (57) ABSTRACT

Apparatuses and methods related to redundant memory and mapping memory addresses to redundant memory are disclosed. An example apparatus includes a plurality of memory sections and a plurality of redundant memory sections. A programmable element block includes a plurality of programmable element sets. A programmable element set is configured to be programmed with location information for a redundant memory section of the plurality of redundant memory sections and further programmed with a respective memory address to be mapped to a redundant memory element of the redundant memory section located by the location information. A programmable element block logic is configured to associate a memory address programmed in a programmable element set with a redundant memory element of the redundant memory section located by the respective location information programmed in the programmable element set.

25 Claims, 7 Drawing Sheets

APPARATUSES AND METHODS FOR MAPPING MEMORY ADDRESSES TO REDUNDANT MEMORY

BACKGROUND

Programmable elements are included in integrated circuits to store information to be retained even when power is not provided to the circuits. The programmable elements are non-volatile and may be programmed to store the desired information. Examples of non-volatile elements include fuses, antifuses, and non-volatile memory elements. Examples of the types of information programmed in the programmable elements of an integrated circuit include device information, device configuration information, device operation information, as well as other information.

In a particular example for memory circuits, programmable elements may be used to store memory address mapping information related to mapping memory addresses to redundant memory elements. Mapping memory address to redundant memory allows for "repairing" defective memory of a main memory array by accessing the redundant memory to which the memory address of the defective memory is mapped instead of the memory of the main memory array that is defective. A redundant memory element typically has a respective associated set of programmable elements that are used to store memory address information when the redundant memory element is used, and a respective set of latches into which a programmed memory address is latched for operation. Thus, when the respective associated set of programmable elements is enabled and programmed with a memory address, the redundant memory element is accessed when a memory access operation is requested for that memory address. However, if a redundant memory element is not used, the respective associated set of programmable elements remains unprogrammed.

As the capacity of memory circuits has increased, the number of redundant memory elements has increased as well. Along with the additional redundant memory elements, a corresponding number of sets of programmable elements and sets of latches have been added. The additional redundant memory elements and respective sets of associated programmable elements and sets of latches result in larger integrated circuit area and increased manufacturing complexity. Often much of the redundant memory elements are not used because there are fewer defective memory locations than available redundant memory elements. The unprogrammed sets of programmable elements and unused redundant memory in effect represent wasted space. The amount of redundant memory elements and respective associated sets of programmable elements could be reduced to address the issue, however, it is desirable to maintain the number of redundant memory elements because the number of defective memory that will be in need of repair is unpredictable.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
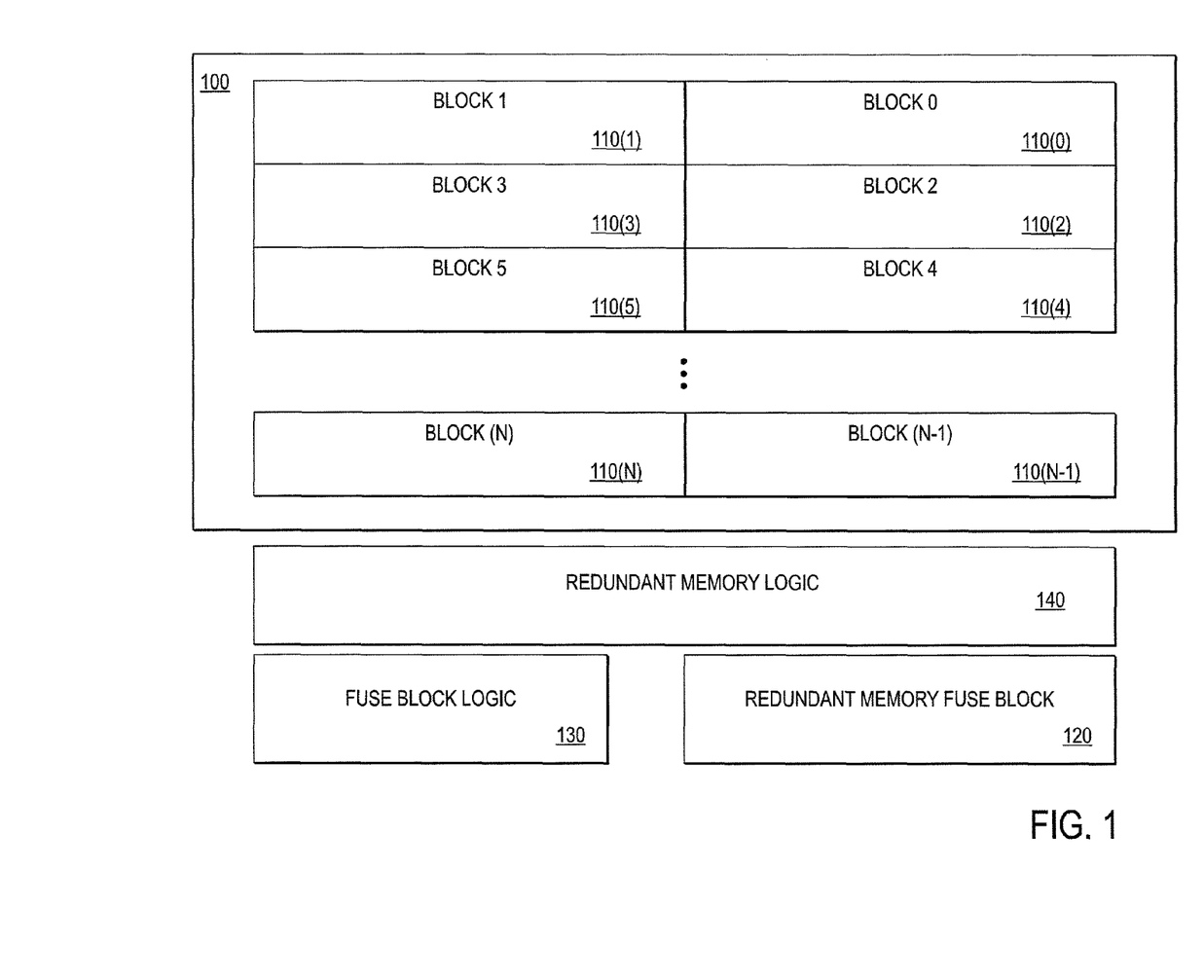
FIG. 1 is a block diagram of an apparatus according to an embodiment of the invention.

FIG. 1 illustrates an apparatus according to an embodiment of the invention. Examples of apparatuses may include an integrated circuit, a memory device, a memory system, an electronic device or system, a smart phone, a tablet, a computer, a server, etc. The apparatus includes a memory array 100 including memory blocks 110(0)-110(N). Greater or fewer memory blocks 110 than those shown in FIG. 1 may be included in other embodiments of the invention. The memory blocks 110 include memory that may be accessed to store information and/or to read the stored information. As will be described in more detail below, the memory blocks include redundant memory (not shown in FIG. 1) to which memory addresses may be mapped, for example, to replace defective memory by mapping memory addresses of the defective memory to the redundant memory. Memory addresses that are mapped to redundant memory are typically identified and programmed during the manufacturing process so that the mapping operation is transparent during use of the apparatus.

The apparatus further includes a redundant memory programmable element block 120 which includes programmable elements (e.g., fuses, antifuses, non-volatile memory, etc.) that are configured to be programmed with the memory addresses of memory that are to be mapped to redundant memory. The programmable elements may be further programmed with location information for redundant memory to which programmed memory addresses are mapped. The programmable elements of the programmable element block 120 may be arranged as sets of programmable elements, with each set of programmable elements configured to be programmed with a memory address to be mapped to redundant memory and location information for the redundant memory to which the respective programmed memory address is to be mapped. The memory address programmed in the programmable elements and mapped to redundant memory may represent one or more memory addresses of memory. That is, one or more memory locations may be mapped to redundant memory by virtue of mapping a memory address to the redundant memory.

Programmable element block logic 130 included in the apparatus is configured to perform operations, for example, to access the sets of programmable elements of the programmable element block 120 and associate any programmed memory addresses with redundant memory to which the programmed memory addresses are mapped, for example, based on the programmed memory addresses and location information. Redundant memory logic 140 included in the apparatus may be configured to perform operations for mapping memory addresses of defective memory to redundant memory during operation of the apparatus, for example, comparing incoming memory addresses of memory to be accessed to addresses of memory that are mapped and accessing the associated redundant memory.

As will be described in more detail below, in contrast to conventional redundant memory arrangements having a set of programmable elements associated with a respective redundant memory element, memory addresses to be mapped to redundant memory elements are programmed in the programmable element block 120 and associated with the redundant memory elements. The total number of programmable elements included in the programmable element block 120 may be less than the total number of programmable elements for conventional redundant memory arrangements, which may allow the number of programmable elements related to redundant memory operation to be reduced while maintaining the number of redundant memory available for memory repair.

Figure 2:
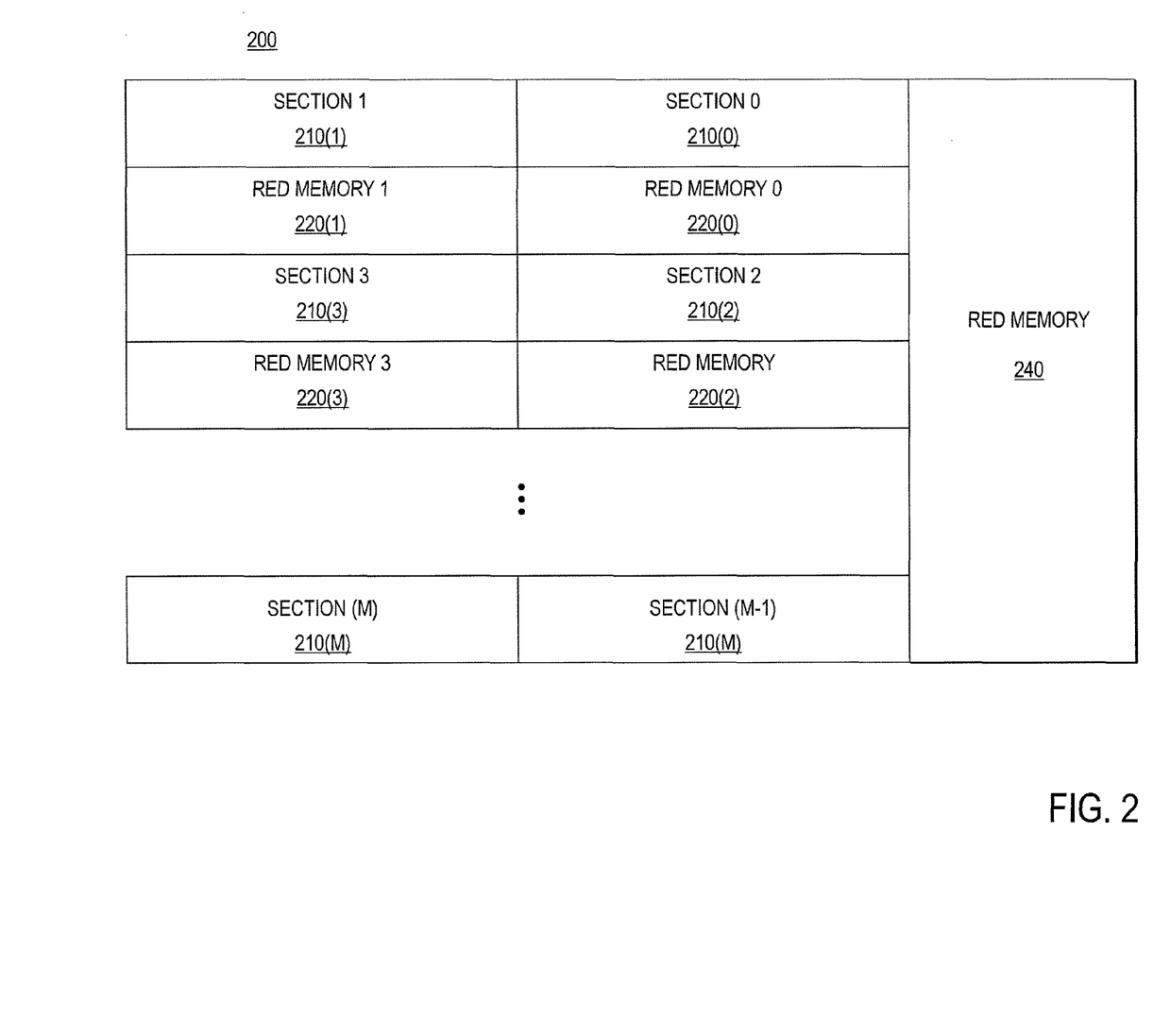
FIG. 2 is a block diagram of a memory block according to an embodiment of the invention.

FIG. 2 illustrates a memory block 200 according to an embodiment of the invention. The memory block 200 may be used to implement a memory block 110 of the apparatus of FIG. 1. The memory block 200 includes memory sections 210(0)-210(M) and redundant memory sections 220(0)-220(M). The memory block 200 further includes redundant memory section 240. Greater or fewer memory sections 210, redundant memory sections 220 and 240 than those shown in FIG. 2 may be included in other embodiments of the invention.

The memory sections 210(0)-210(M) include memory that may be accessed to store information and to retrieve stored information. The memory of memory sections 210 may be arranged in rows and columns, with a memory cell located at the intersection of a row and column, which may be accessed by providing row and column addresses corresponding to the row and column. The redundant memory sections 220(0)-210(M) include redundant memory elements (not shown in FIG. 2) to which memory addresses may be mapped, for example, to replace defective memory. A redundant memory section 220 is associated with a respective memory section 210, and memory addresses for memory of the respective memory section 210 may be mapped to redundant memory elements of the associated redundant memory section 220. For example, memory addresses for memory of memory section 210(0) may be mapped to redundant memory elements of redundant memory section 220(0), memory addresses for memory of memory section 210(1) may be mapped to redundant memory elements of redundant memory section 220(1), memory addresses for memory of memory section 210(2) may be mapped to redundant memory elements of redundant memory section 220(2), and so on. The redundant memory section 240 includes redundant memory elements that may be shared among the memory addresses of the memory sections 210(0)-210(M). That is, the memory addresses for any of the memory of the memory sections 210(0)-210(M) may be mapped to the redundant memory section 240.

In some embodiments, the redundant memory elements of the redundant memory section 220 are columns of redundant memory to which the memory addresses of a column or columns of memory of the associated memory section 210 may be mapped. A redundant memory element of redundant memory section 220 may be one column of redundant memory or a group of two or more columns of redundant memory. In some embodiments, the redundant memory elements of the redundant memory section 240 are row of redundant memory to which the memory addresses of a row or rows of memory of the memory sections 210(0)-210(M) may be mapped. A redundant memory element of redundant memory section 240 may be one row of redundant memory or a group of two or more rows of redundant memory. The redundant memory elements of the redundant memory sections 220 and 240 may have other configurations as well. For example, the redundant memory elements of the redundant memory sections 220 and/or 240 may include one or more memory sections of redundant memory, or one or more memory blocks of redundant memory. The memory sections and/or memory blocks of redundant memory may also be shared with one or more of the memory sections 210(0)-210(M).

Figure 3:
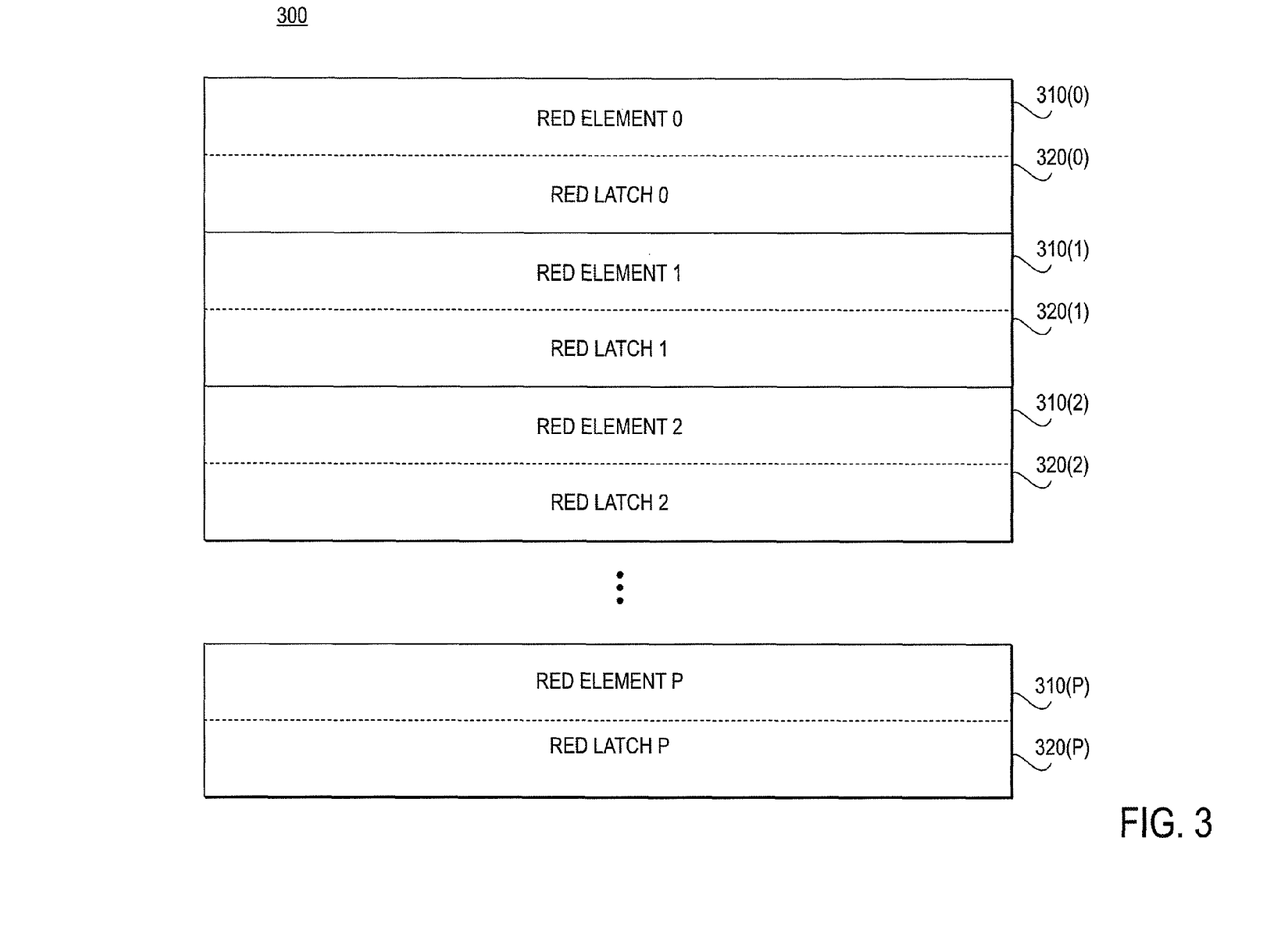
FIG. 3 is a block diagram of a redundant memory section according to an embodiment of the invention.

FIG. 3 illustrates a redundant memory section 300 according to an embodiment of the invention. The redundant memory section 300 includes redundant memory elements 310(0)-310(P) and redundant address latches 320(0)-320(P). Greater or fewer redundant memory elements 310(0)-310(P) and redundant address latches 320(0)-320(P) than those shown in FIG. 3 may be included in other embodiments of the invention.

A redundant address latch 320 is associated with a respective redundant memory element 310. A memory address may be mapped to a redundant memory element 310 by latching the memory address to be mapped in the associated redundant address latch 320. For example, a memory address latched in redundant address latch 320(0) is mapped to redundant memory element 310(0), a memory address latched in redundant address latch 320(1) is mapped to redundant memory element 310(1), a memory address latched in redundant address latch 320(2) is mapped to redundant memory element 310(2), and so on. The memory address that is latched in a redundant address latch 320 may be a memory address programmed in the programmable element block 120 (FIG. 1). By latching in the redundant address latch 320 a memory address programmed in the programmable element block 120, the memory address is associated with the redundant memory element 310 to which the redundant address latch 320 is associated.

The redundant memory elements 310(0)-310(P) may have various configurations. For example, a redundant memory element 310 may include one or more redundant columns of memory. In other embodiments, a redundant memory element 310 may include one or more rows of redundant memory. A redundant memory element 310 may include one or more memory sections of redundant memory, or one or more memory blocks of redundant memory. Additionally, several memory addresses, for example, memory addresses for memory along a column or columns of memory or memory addresses for memory along a row or rows of memory, may be mapped to a redundant memory element when associated with a memory address.

Figure 4:
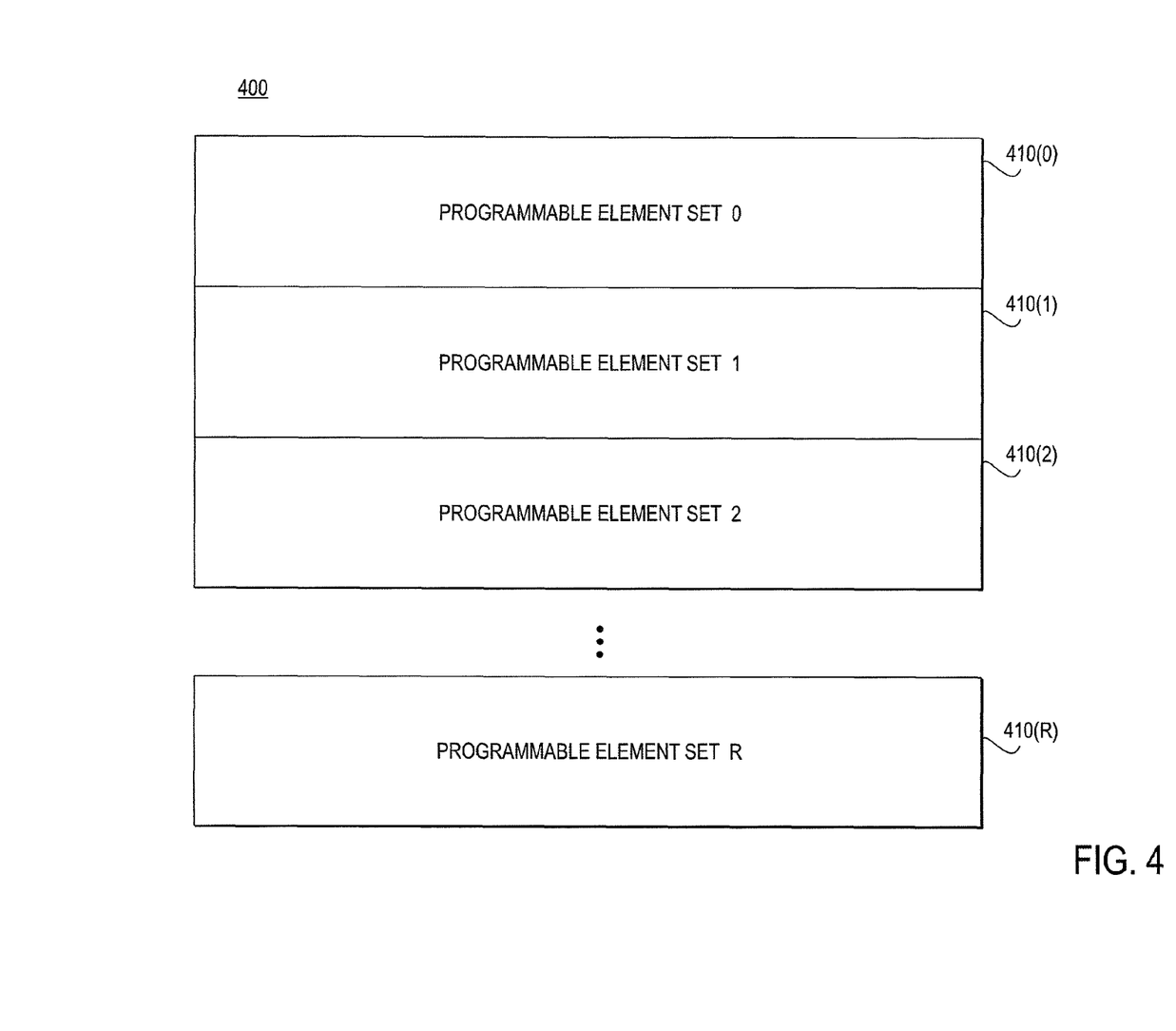
FIG. 4 is a block diagram of a redundant memory programmable element block according to an embodiment of the invention.

FIG. 4 illustrates a programmable element block 400 according to an embodiment of the invention. The programmable element block 400 includes programmable elements (e.g., fuses, antifuses, non-volatile memory, etc.) that may be programmed to store information in a non-volatile manner. The programmable elements may be programmed at manufacture of an apparatus including the programmable element block 400, for example, during testing of the apparatus. In some embodiments, the programmable element block 400 includes an array of programmable elements that may be used to program information for mapping memory addresses to redundant memory. In some embodiments, the programmable elements of the programmable element block 400 may be arranged in programmable element sets 410(0)-410(R).

The programmable elements of a programmable element set 410 may be programmed with a memory address to be mapped to redundant memory element. Additional information, for example, location information for the redundant memory section to which the programmed memory address is mapped, may also be programmed in the programmable elements of the programmable element set 410. A programmable element set 410 may further include enable information, which may be used to indicate that a programmable element set having the enable information programmed has been programmed with a memory address. Greater or fewer programmable element sets 410(0)-410(R) than those shown in FIG. 4 may be included in other embodiments of the invention.

The programmable element block 400 may be used for mapping memory addresses of different-sized memory spaces. For example, in some embodiments, a programmable element block 400 may be used for mapping memory addresses of an entire array of memory. In some embodiments, a programmable element block 400 may be used for mapping memory addresses of a portion of the array, such as for one or more memory blocks, or for one or more memory sections. An apparatus may include one or more programmable element blocks for programming memory addresses to be mapped.

Figure 5:
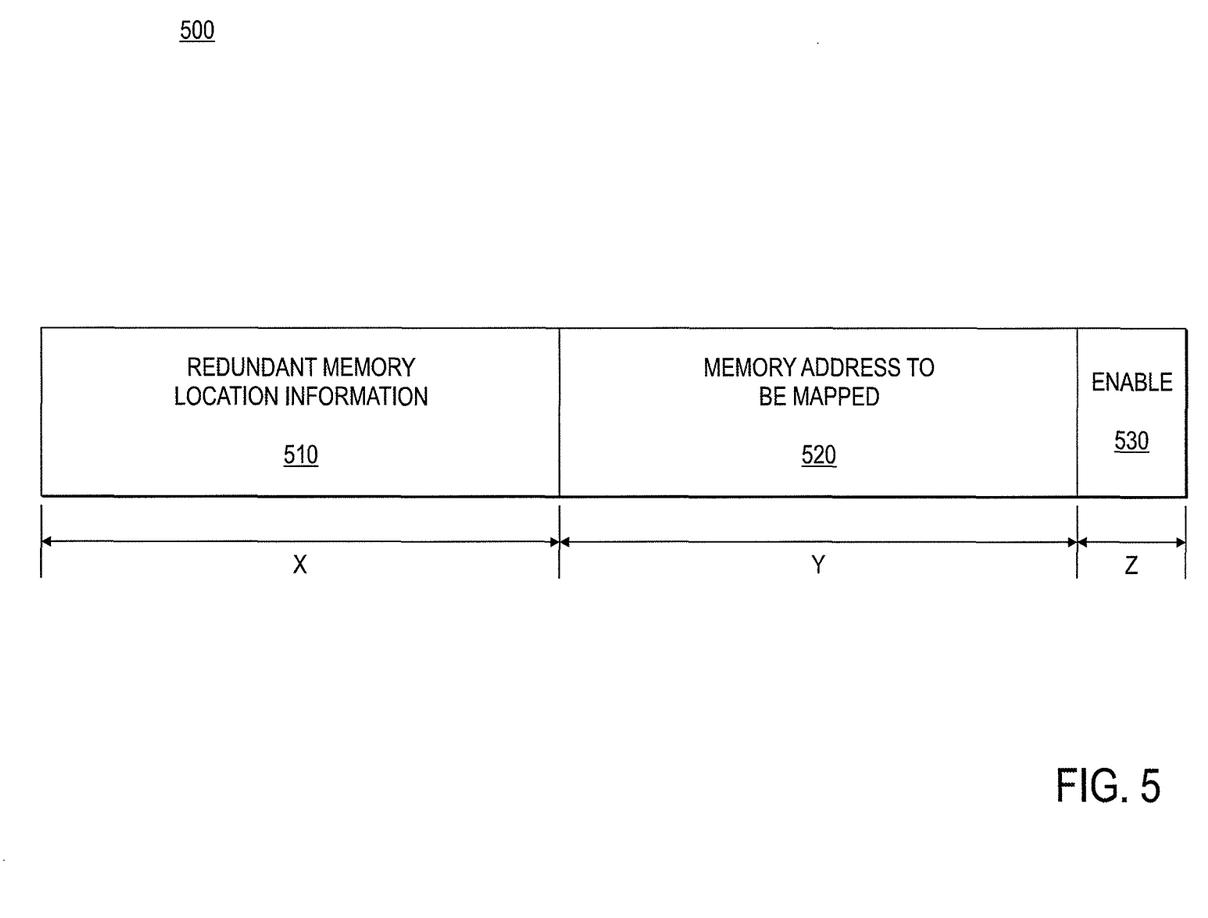
FIG. 5 is a block diagram of information programmed in a programmable element set according to an embodiment of the invention.

FIG. 5 illustrates information 500 that may be programmed in a programmable element set according to an embodiment of the invention. The information 500 includes redundant memory location information 510 that includes X bits of information, a memory address to be mapped information 520 that includes Y bits of information, and enable information 530 that includes Z bits of information. The memory address to be mapped information 520 is programmed with the memory address to be mapped to redundant memory. The redundant memory location information 510 may be programmed with information that locates the redundant memory section including a redundant memory element to which the programmed memory address is to be mapped. The enable information 530 may be programmed to indicate that the programmable element set has been programmed, for example, with a memory address to be mapped and location information for a redundant memory section.

The number of bits for the redundant memory location information 510 and the memory address to be mapped 520 may be based at least in part, for example, on the configuration of redundant memory sections for a region of memory, and the configuration of memory for the region of memory. By way of a non-limiting example, a memory array may include 16 memory blocks, with each memory block including 16 memory sections. Thus, the memory array includes a total of 256 memory sections. Each of the memory sections is associated with a respective redundant memory section (for a total of 256 redundant memory sections) to which memory addresses for the associated memory section may be mapped. The redundant memory section includes redundant memory elements, each of which may be used for mapping one of 128 different memory addresses of the associated memory section (e.g., a memory section may include 128 columns of memory, with each column of memory having a respective column address).

In the present example, the redundant memory location information 510 may include 8-bits of information to select one of the 256 redundant memory sections, for example, to locate a redundant memory section to which memory addresses of the associated memory section may be mapped. The memory address to be mapped 520 may include 7-bits of information to identify which of the 128 different memory addresses of a memory section will be mapped to a redundant memory element. The enable information 530 may have 1-bit of information, which when programmed (e.g., to a high logic level) indicates that the programmable element set has been programmed with information.

In some embodiments, the number of bits for the information programmed in a programmable element set may be different, for example, between programmable element sets configured to be programmed with information for mapping column addresses to columns of redundant memory and programmable element sets configured to be programmed with information for mapping row addresses to rows of redundant memory. In some embodiments, a programmable element set includes information in addition, or in the alternative to the information previously described with reference to FIG. 5. For example, additional information that may be programmed to indicate whether the programmable element set includes information related to a column address for mapping to a column of redundant memory or related to a row address for mapping to a row of redundant memory. Programmable element sets for mapping a column address to a column of redundant memory and a row address to a row of redundant may include the same or different information.

As previously described, the information programmed in a programmable element set may be used to locate the redundant memory section to which the memory address also programmed in the programmable element set is to be mapped. Which of the redundant memory elements of the located redundant memory section (e.g., by the redundant memory location information 510) used for the mapping will be described in greater detail below.

Figure 6:
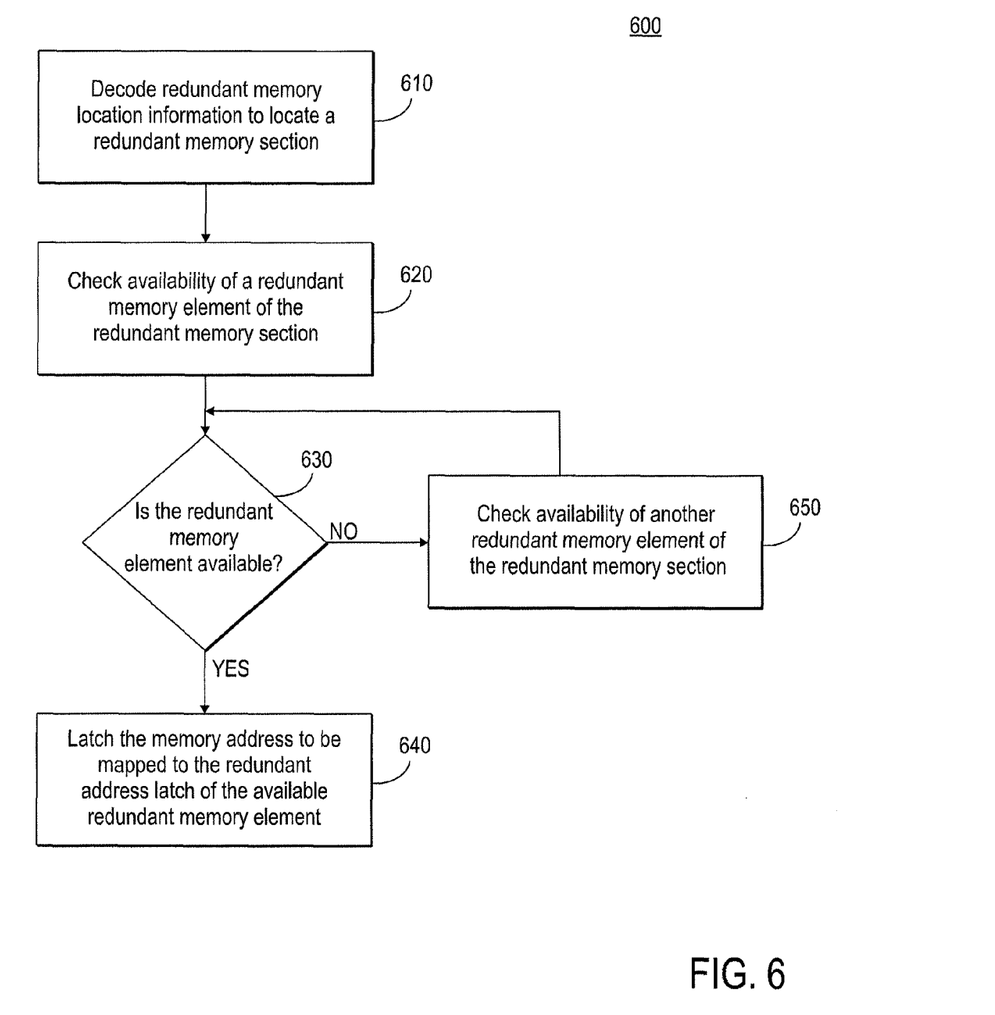
FIG. 6 is a flow diagram of an operation according to an embodiment of the invention for associating a memory address with redundant memory.

FIG. 6 illustrates a flow diagram of an operation 600 according to an embodiment of the invention for associating a memory address to a redundant memory element of a redundant memory section using information programmed in a redundant memory programmable element block (e.g., redundant memory programmable element block 120 of FIG. 1). The operation 600 may be performed by programmable element block logic, for example, programmable element block logic 130.

At step 610 the redundant memory location information for a programmable element set is decoded to locate a redundant memory section. The redundant memory section located by the redundant memory location information is associated with a respective memory section having a memory address that is to be mapped to a redundant memory element in the redundant memory section. Following the locating of the redundant memory section based on the redundant memory location information, at step 620 availability of a redundant memory element of the redundant memory section to be associated with a memory address is checked. A redundant memory element may be not be available, for example, if it has already been enabled to have a memory address mapped to it (e.g., the respective redundant address latch has a memory address already latched) or the redundant memory element is inoperable (e.g., defective).

If it is determined at step 630 that the redundant memory element is available, the memory address to be mapped that is programmed in the same programmable element set as the redundant memory location information is latched into the redundant address latch of the available redundant memory element at step 640. As a result of latching the memory address in the redundant address latch, the redundant memory element now associated with the memory address will be accessed instead of the memory in the memory section corresponding to the memory address. If it is determined at step 630 that the redundant memory element is not available, the availability of another redundant memory element of the located redundant memory section is checked. If the other redundant memory element is available, the memory address to be mapped is latched in the redundant address latch for the available redundant memory element. However, if the other redundant memory element is not available, yet another redundant memory element of the redundant memory section is checked for availability.

The availability of a redundant memory element may be indicated by enable information associated with the redundant memory element and/or with the redundant address latch. A redundant memory element and/or associated redundant address latch that is indicated as enabled is not available for latching a memory address, such as when the redundant address latch already latches a memory address, or when the redundant memory element is inoperable.

In some embodiments, enable information is latched by a portion of the redundant address latch responsive to latching of a memory address programmed in a programmable element set. Enable information programmed with a memory address in the programmable element set enable information (e.g., enable information 530 of FIG. 5) may be latched as the enable information for the redundant memory element, indicating that the redundant memory element and/or associated redundant address latch is enabled and not available to latch a memory address. In some embodiments, inoperable redundant memory elements may be identified during manufacturing of the memory, and enable information may be programmed for the redundant memory element and/or associated redundant address latch to indicate that the redundant memory element is unavailable. The enable information may be programmed, for example, by programming a programmable element or elements (e.g., fuses, antifuses, non-volatile memory) associated with the redundant memory element and/or associated redundant address latch.

As previously discussed, a memory address to be mapped is programmed in a programmable element set along with location information for redundant memory to which the memory address may be mapped. All of the memory addresses programmed in the programmable element sets of a programmable element block are associated to redundant memory to complete the mapping. An operation may be performed to associate the memory addresses programmed in the programmable element block to the redundant memory. The operation 600 previously described is an example of an operation that associates the programmed memory address with a particular redundant memory element of the located redundant memory. Other operations for associating memory addresses and redundant memory may be used as well.

The association of memory addresses and redundant memory may be performed responsive to an event, for example, upon power-up of a memory. In some embodiments, the association of memory addresses and redundant memory may be performed responsive to a user provided command and/or to an internal command generated when an operating condition occurs.

Figure 7:
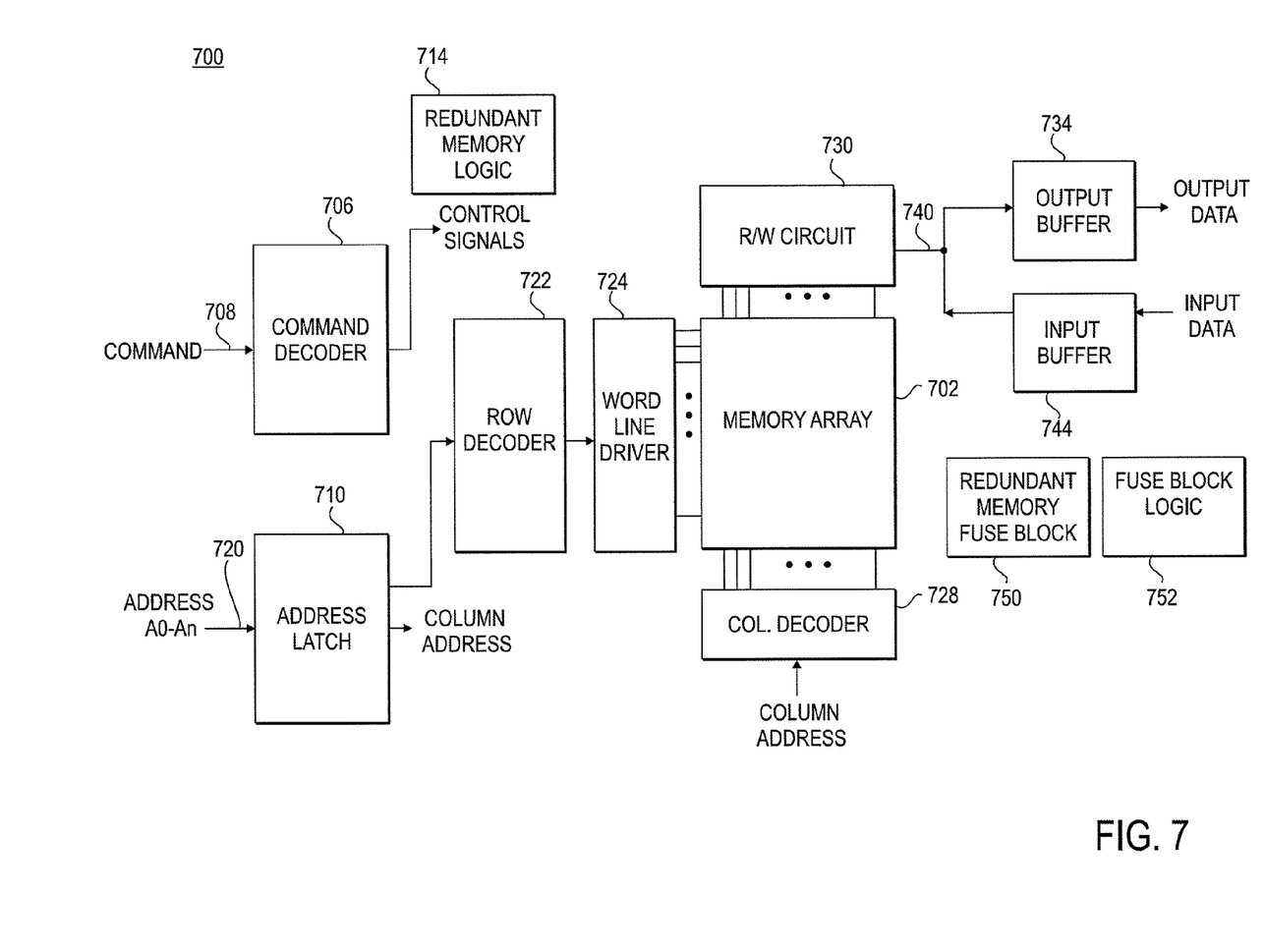
FIG. 7 is a block diagram of a memory according to an embodiment of the invention.

FIG. 7 illustrates a portion of a memory 700 according to an embodiment of the present invention. The memory 700 includes an array 702 of memory, which may be, for example, be volatile memory, non-volatile memory, or some other type of memory. The array 702 also includes redundant memory to which memory addresses of the array 702 may be mapped. The memory 700 includes a command decoder 706 that receives memory commands through a command bus 708 and generates corresponding control signals within the memory 700 to carry out various memory operations. Row and column address signals are applied to the memory 700 through an address bus 720 and provided to an address latch 710. The address latch then outputs a separate column address and a separate row address. Redundant memory logic 714 is configured to perform operations for mapping memory addresses to redundant memory, for example, comparing incoming memory addresses to addresses of memory that are mapped, and accessing the associated redundant memory. For example, where a memory address received by the memory 700 matches a memory address programmed in the programmable element block 750 redundant memory associated with the memory address is accessed.

The memory further includes a redundant memory programmable element block 750 and programmable element block logic 752 according to an embodiment of the invention. The redundant memory programmable element block 750 which includes programmable elements that are configured to be programmed with the memory addresses of memory that are to be mapped to redundant memory, as well as additional information, such as redundant memory location information and enable information. The programmable element block logic 752 is configured to perform operations, for example, to access the sets of programmable elements of the programmable element block 750 and associate any programmed memory addresses with redundant memory to which the programmed memory addresses are mapped based on the programmed memory addresses and location information.

The row and column addresses are provided by the address latch 710 to a row address decoder 722 and a column address decoder 728, respectively. The column address decoder 728 selects bit lines extending through the array 702 corresponding to respective column addresses. The row address decoder 722 is connected to word line driver 724 that activates respective rows of memory cells in the array 702 corresponding to received row addresses. The selected data line (e.g., a bit line or bit lines) corresponding to a received column address are coupled to a read/write circuitry 730 to provide read data to a data output buffer 734 via an input-output data bus 740. Write data are applied to the memory array 702 through a data input buffer 744 and the memory array read/write circuitry 730. The command decoder 706 responds to memory commands applied to the command bus 708 to perform various operations on the memory array 702. In particular, the command decoder 706 is used to generate internal control signals to read data from and write data to the memory array 702.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a plurality of memory sections;
   a plurality of redundant memory sections, wherein a redundant memory section of the plurality of redundant memory sections is associated with a respective memory section of the plurality of memory sections;
   a redundant memory programmable element block including a plurality of programmable element sets, wherein a programmable element set of the plurality of programmable element sets is configured to be programmed with a respective memory address to be mapped to a redundant memory element of a redundant memory section of the plurality of redundant memory sections, and further programmed with location information for the redundant memory section that includes the redundant memory element to which the respective memory address is to be mapped, and wherein the programmable element set of the plurality of programmable element sets is configured to be further programmed with enable information indicating that the programmable element set has been programmed; and programmable element block logic coupled to the redundant memory programmable block and configured to associate a memory address programmed in a programmable element set of the plurality of programmable element sets with a redundant memory element of the redundant memory section located by the respective location information programmed in the programmable element set.

2. The apparatus of claim 1 wherein the redundant memory section of the plurality of redundant memory sections further includes a redundant address latch for the redundant memory element.

3. The apparatus of claim 1 wherein the programmable element sets comprise antifuse sets.

4. The apparatus of claim 1 wherein the programmable element block logic is configured to associate the memory address with a next available redundant memory element of the redundant memory section.

5. The apparatus of claim 1 wherein the plurality of memory sections are included in a memory block.

6. The apparatus of claim 1 wherein the redundant memory section of the plurality of redundant memory sections that is associated with the respective memory section of the plurality of memory sections is limited to having memory addresses of the respective memory section of the plurality of memory sections mapped thereto.

7. The apparatus of claim 1, further comprising redundant memory logic configured to compare incoming memory addresses of memory to be accessed to memory addresses programmed in the redundant memory programmable element block to identify a memory address to be mapped to redundant memory.

8. The apparatus of claim 2 wherein the programmable element block logic is configured to latch the memory address in the redundant memory address latch of the redundant memory element to associate a memory address programmed in a programmable element set.

9. An apparatus, comprising
a redundant memory section including a redundant memory element;
a plurality of programmable element sets, each of the programmable element sets of the plurality of programmable element sets including programmable elements configured to be programmed with a memory address to be mapped and programmed with respective location information for a redundant memory section, and wherein the programmable element set of the plurality of programmable element set is configured to be further programmed with cable information;
a redundant memory element configured to have a memory address mapped thereto, wherein the redundant memory element is included in a redundant memory section located by the location information programmed in any of the plurality of programmable element sets; and
a redundant address latch associated with the redundant memory element and configured to latch the memory address programmed in the programmable element set of the plurality of programmable elements sets that includes the location information locating the redundant memory section including the redundant memory element.

10. The apparatus of claim 9 wherein the redundant memory element comprises a column of redundant memory.

11. The apparatus of claim 9 wherein the redundant memory element comprises a row of redundant memory.

12. The apparatus of claim 9, further comprising a memory section wherein the memory section includes the memory address latched in the redundant address latch.

13. The apparatus of claim 9 wherein the redundant memory element is a first memory element included in a first redundant memory section and the redundant address latch is a first redundant address latch, and the apparatus further comprises:
a second redundant memory element configured to have a memory address mapped thereto, wherein the second redundant memory element is included in a second redundant memory section located by the location information programmed in any of the plurality of programmable element sets; and
a second redundant address latch associated with the second redundant memory element and configured to latch the memory address programmed in the programmable element set of the plurality of programmable element sets that includes the location information locating the second redundant memory section, wherein the second memory section is a different memory section from the first memory section.

14. The apparatus of claim 9 wherein the redundant memory element is a first memory element included in a first redundant memory section and the redundant address latch is a first redundant address latch, and the apparatus further comprises:
a second redundant memory element configured to have a memory address mapped thereto, wherein the second redundant memory element is included in the first redundant memory section located by the location information programmed in a second one of the plurality of programmable element sets; and
a second redundant address latch associated with the second redundant memory element and configured to latch the memory address programmed in the second one of the plurality of programmable element sets.

15. A method comprising:
decoding location information for redundant memory, the redundant memory including redundant memory elements;
checking availability of a first redundant memory element included in the redundant memory;
associating a memory address with the first redundant memory element responsive to the first redundant memory element being available by latching the memory address in a redundant address latch associated with the first redundant memory element;
checking availability of a second redundant memory element included in the redundant memory responsive to the first redundant memory element not being available;
associating the memory address with the second redundant memory element responsive to the second redundant memory element being available; and
checking availability of a third redundant memory element included in the redundant memory responsive to the second redundant memory element not being available.

16. A method comprising:
decoding location information for redundant memory, the redundant memory including redundant memory elements;
checking availability of a first redundant memory element included in the redundant memory;
associating a memory address with the first redundant memory element responsive to the first redundant memory element being available by latching the memory address in a redundant address latch associated with the first redundant memory element; and checking availability of a second redundant memory element included in the redundant memory responsive to the first redundant memory element not being available;

wherein checking availability of the first redundant memory element comprises checking enable information of a redundant address latch for the first redundant memory element.

17. The method of claim 16 wherein the location information for the redundant memory and the memory address are programmed in a programmable element set of a programmable element bank, wherein the programmable element bank includes other programmable elements sets programmed with location information for different redundant memories.

18. The method of claim 16 wherein decoding location information for redundant memory comprises decoding location information to locate a redundant memory section, the redundant memory section including the first and second redundant memory elements.

19. The method of claim 16, further comprising latching enable information in a redundant address latch associated with the first redundant memory element responsive to the first redundant memory element being available, wherein the enable information is indicative of the redundant address latch being enabled and not available for latching a memory address.

20. A method, comprising:

latching a first memory address in a first redundant address latch associated with a first redundant memory element, wherein the first redundant memory element is included in a first redundant memory section associated with a first memory section and including a first plurality of redundant memory elements limited to having memory addresses of the first memory section mapped thereto; and latching a second memory address in a second redundant address latch associated with a second redundant memory element, wherein the second redundant memory element is included in a second redundant memory section associated with a second memory section and including a second plurality of redundant memory elements limited to having memory addresses of the second memory section mapped thereto, wherein the first and second redundant memory sections are different memory sections, and wherein the first memory address is programmed in a first programmable element set of a programmable element block and the second memory address is programmed in a second programmable element set of the programmable element block, wherein the latching of the first memory address and the latching of the second memory address are responsive to power-up.

21. The method of claim 20, further comprising:

locating the first redundant memory section based on redundant memory location information programmed in the first programmable element set; and locating the second redundant memory section based on redundant memory location information programmed in the second programmable element set.

22. The method of claim 20 wherein latching the first memory address in a first redundant address latch comprises:

checking availability of the first plurality of redundant memory elements; and latching the first memory address in a first available redundant memory element of the first plurality of redundant memory elements.

23. The method of claim 22, further comprising:

checking availability of the first plurality of redundant memory elements; and latching a third memory address in a third redundant address latch associated with a third redundant memory element, wherein the third redundant memory element is included in the first redundant memory section associated with the first memory section and the third redundant memory element is a next available redundant memory element of the first plurality of redundant memory elements, and wherein the third memory address is programmed in a third programmable element set of the programmable element block.

24. The method of claim 20 wherein the latching of the first memory address and the latching of the second memory address are responsive to a user command.

25. The method of claim 20 wherein the latching of the first memory address and the latching of the second memory address are responsive to an internal command.

* * * * *